(12) United States Patent
Lehr et al.

(10) Patent No.: US 6,559,067 B2
(45) Date of Patent: May 6, 2003

(54) METHOD FOR PATTERNING AN ORGANIC ANTIREFLECTION LAYER

(75) Inventors: Matthias Lehr, Dresden (DE); Gregoire Grandremy, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/073,554

(22) Filed: Feb. 11, 2002

(65) Prior Publication Data

US 2002/0160618 A1 Oct. 31, 2002

Related U.S. Application Data

(63) Continuation of application No. PCT/EP00/07781, filed on Aug. 10, 2000.

(30) Foreign Application Priority Data

Aug. 11, 1999  (DE) .......................... 199 37 995

(51) Int. Cl.⁷ .......................... H01L 21/31; G03F 7/00; B32B 9/00
(52) U.S. Cl. .................. 438/763; 438/761; 438/710; 438/749; 430/313; 428/216
(58) Field of Search ................. 438/763, 789, 438/761, 781, 790, 791, 792, 793, 710, 717, 749, 706; 428/408, 212, 216, 336, 446; 430/313, 316

(56) References Cited

U.S. PATENT DOCUMENTS

| 5,302,240 | A |   | 4/1994  | Hori et al. |
|-----------|---|---|---------|-------------|
| 5,656,128 | A |   | 8/1997  | Hashimoto et al. |
| 5,773,199 | A |   | 6/1998  | Linliu et al. |
| 5,804,088 | A |   | 9/1998  | McKee |
| 5,981,398 | A | * | 11/1999 | Tsai et al. .................. 438/710 |
| 5,998,100 | A | * | 12/1999 | Azuma et al. ............. 430/313 |
| 6,428,894 | B1| * | 8/2002  | Babich et al. ............. 428/408 |

FOREIGN PATENT DOCUMENTS

JP        09 134 862 A      5/1997

* cited by examiner

Primary Examiner—Long Pham
Assistant Examiner—Hoa B. Trinh
(74) Attorney, Agent, or Firm—Laurence A. Greenberg; Werner H. Stemer; Gregory L. Mayback

(57) ABSTRACT

An antireflection coating (ARC) polymer layer is patterned by DUV (deep ultraviolet) lithography followed by an ARC open etching step and subsequent etching of the metal layer. Low resist consumption and hence steeper resist sidewalls are achieved by virtue of the ARC polymer intermediate layer being etched with a $CF_4$ ARC open process with high selectivity with respect to the photoresist. The gas flows are set to the following ranges: $CF_4$ 35–45 sccm, $CHF_3$ 17–23 sccm, $O_2$ 5–7 sccm and Ar 80–120 sccm.

2 Claims, 2 Drawing Sheets

METHOD FOR PATTERNING AN ORGANIC ANTIREFLECTION LAYER

CROSS-REFERENCE TO RELATED APPLICATION

This application is a continuation of copending International Application No. PCT/EP00/07781, filed Aug. 10, 2000, which designated the United States.

BACKGROUND OF THE INVENTION

Field of the Invention

The invention relates to a method for patterning an organic antireflection layer by means of DUV (deep ultraviolet) lithography followed by an ARC (anti-reflection coating) open etching step. The antireflection layer, which comprises an organic polymer, is formed below the photoresist layer as an intermediate layer. The metal layer situated beneath the antireflection layer is then etched in a subsequent step.

Semiconductor structures are usually equipped with a multilevel metalization with corresponding interconnects that are connected via vertical intermediate connections to one another and/or to active or doped elements of the semiconductor structure. The interconnects and the intermediate connections are fabricated in a plurality of process steps which comprise deposition, patterning, and etching steps.

A customary method for fabricating a two-level metalization consists in firstly fabricating a connection to individual functional elements of the semiconductor structure. To that end, with the aid of a photolithographic process followed by an etching step, an opening is produced through the oxide layer situated on the semiconductor structure, thereby defining the position of the intermediate connection in the first metalization plane. This opening, which extends vertically through the semiconductor structure, is subsequently filled with a thin adhesion layer (also referred to as liner), e.g. titanium nitride, and a metal, e.g. tungsten, in a deposition process, e.g. a CVD (chemical vapor deposition) or sputtering method. Since the deposition process cannot be limited just to the opening, rather deposition is effected on the entire surface of the semiconductor structure, the excess metal on the surface must be removed for example by means of a so-called CMP (chemical mechanical polishing) process or by etching-back. Afterwards, a metalization, e.g. made of aluminum, is applied on the oxide layer present and is then patterned photolithographically in order to produce the desired interconnect structure. That is done by applying a photoresist from which a photoresist etching mask is formed photolithographically, so that etching can then be effected through the etching mask and, finally, the interconnects remain.

A photolithography method is used for this as standard, in which method an organic intermediate layer made of a polymer, i.e. an ARC (anti reflecting coating layer) polymer as antireflection layer, is inserted below the photoresist layer in order to preclude reflections during the exposure of the photoresist and hence to minimize the reflected light and thereby to improve the resolution. This involves a standard photo-process for sub-0.5 mm technologies with DUV exposure.

However, in the process—which is effected after the photolithographic step for forming the photoresist etching mask—of etching the metal layer situated beneath the intermediate layer, this intermediate (ARC polymer) leads to problems. The ARC polymer layer is not opened during the photolithographic process. Therefore, the etching process for patterning the interconnects must begin with an ARC open etching step (polymer etch). The second step is then the metal etching step (normal two-step process).

Furthermore, a good ARC open etching must satisfy various stipulations. These stipulations consist in realizing a low consumption of resist, which is difficult to realize in view of the mutually conflicting requirements made of the thickness of the photoresist (photoresist etching mask) by the etching process and the photolithography. The thinnest possible resist layer is required for the photolithography and the thickest possible resist layer is required for the etching. Furthermore, it is necessary to guarantee a good dimensional accuracy of the structures (i.e. good CD performance) and freedom from residues.

By way of example, $N_2$, $O_2$ or $N_2$, $O_2$ and CO are used for etching ARC layers. The high consumption of resist and oblique resist edges are noted as particular disadvantages here. Moreover, a poor CD (critical dimension) performance results in that the line width decreases and the line ends are patterned with a taper.

When etching with $CHF_3/CF_4/O_2/Ar$ or $CHF_3/CF_4/O_2$ gases (gas flow 80/50/20/16 sccm, p=160 mTorr, P=600W, B=20 Gauss) the CD performance is very poor, i.e. the line widths are reduced to an excessively great extent.

SUMMARY OF THE INVENTION

It is accordingly an object of the invention to provide a method for patterning an organic antireflection layer, which overcomes the above-mentioned disadvantages of the heretofore-known devices and methods of this general type and which provides for a low consumption of resist and, in particular, results in steeper resist sidewalls and a significantly improved CD performance.

With the foregoing and other objects in view there is provided, in accordance with the invention, a method for patterning an organic antireflection layer by DUV lithography followed by ARC open etching. The method comprises:

providing a substrate with a metal layer, a photoresist, and an antireflection layer as an intermediate layer of an organic polymer formed between the photoresist and the metal layer;

etching the (ARC polymer) intermediate layer in a $CF_4$ ARC open process with the following process parameters:

| | | |
|---|---|---|
| $CF_4$ | 35 ... 45 | sccm |
| $CHF_3$ | 17 ... 23 | sccm |
| $O_2$ | 5 ... 7 | sccm |
| Ar | 80 ... 120 | sccm |
| Pressure | 80 ... 120 | mtorr |
| Power | 550 ... 650 | Watts | and with high selectivity with respect to the photoresist; and subsequently etching the metal layer beneath the antireflection layer.

In accordance with a concomitant feature of the invention, the etching is performed in an etching chamber with plasma assistance According to the invention, the polymer intermediate layer is etched by means of a $CF_4$ ARC open process with high selectivity with respect to the photoresist, the etching being performed in an etching chamber with plasma assistance with an RF power of approximately 600 W.

In order to increase the etching selectivity, the $CF_4$ ARC open process is assisted by a proportion of $CHF_3$ and a small proportion of $O_2$.

The unit sccm pertains to the gas flow of the $CF_4$, $CHF_3O_2$, and Ar gas feed.

The advantages of the method according to the invention are a low consumption of resist and steep resist sidewalls. That makes it possible to use smaller resist thicknesses, thereby extending the process window of the lithography. The steeper resist sidewalls result in a very good CD performance, since the line widths remain constant and the line ends maintain their form. Moreover, no residues, so-called fences, remain on the resist sidewalls.

A further advantage of the invention is to be seen in the fact that, by virtue of the F ions in the etching chemistry, it becomes possible to introduce automatic end point identification. This end point identification prevents overetching and thus unnecessary resist attacks.

Other features which are considered as characteristic for the invention are set forth in the appended claims.

Although the invention is illustrated and described herein as embodied in a method for patterning organic antireflection layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
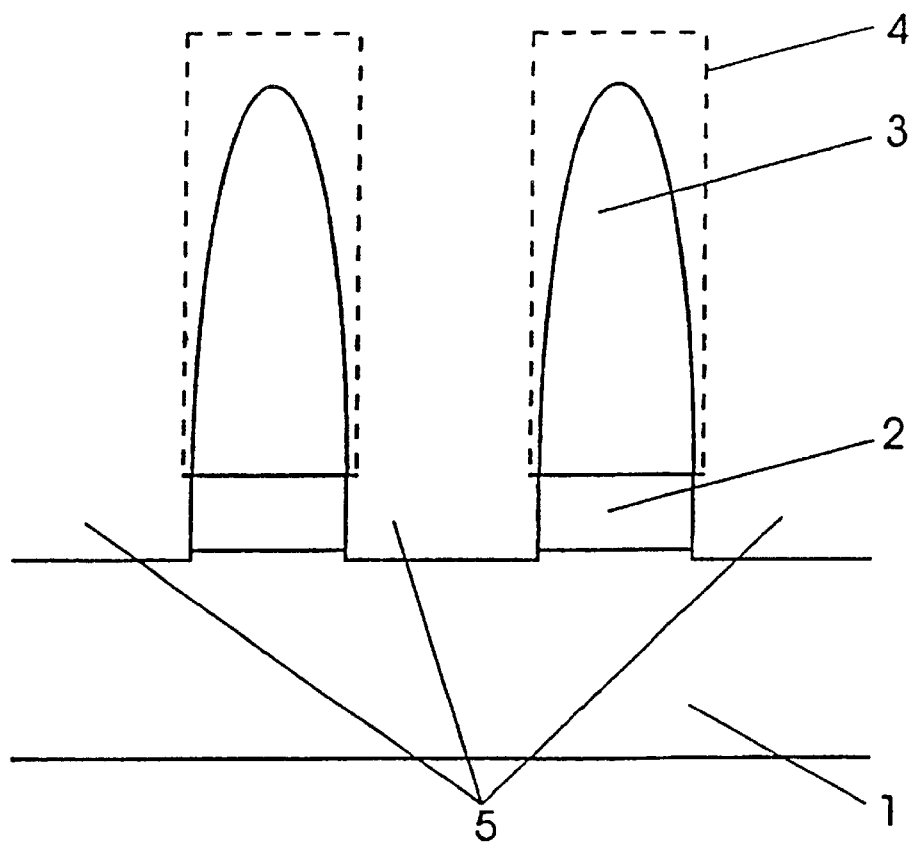
FIG. 1 is a diagrammatic illustration of an etching structure of the photoresist which is produced by the conventional methods.

Referring now to the figures of the drawing in detail and first, particularly, to FIG. 1 thereof, there is shown a metal layer 1, which is intended to represent the initially uppermost layer of a wafer. An intermediate layer made of a polymer, i.e. an ARC (anti reflecting coating layer) polymer as antireflection layer 2, is applied on the the metal layer 1. With the aid of the antireflection layer 2, reflections are precluded during the exposure of the photoresist situated on the antireflection layer 2 and, consequently, the reflected light is minimized. In this way, the resolution of the photolithography is improved and a high dimensional accuracy of the photoresist etching mask 3 is ensured. As a result, it is possible to use the standard photo-process for sub-0.5 mm technologies with DUV (deep ultraviolet) exposure. Antireflection layers 2 of this type may comprise organic or inorganic materials. The method described in the following relates particularly to the patterning of an organic polymer antireflection layer.

FIG. 1, then, indicates the state of the layers including the photoresist etching mask 3 after the ARC open process has been carried out in a conventional prior art process. That part of the photoresist 4 which is shown interrupted shows the state of the photoresist before the ARC open etching. It can clearly be seen that a considerable consumption of resist has taken place here and that a poor CD performance is achieved. That is due to the fact that the photoresist has been reduced not only in height but also in width, so that the etching trench 5 in the ARC layer 2 becomes larger than intended.

If, by way of example, $N_2$, $O_2$ or $N_2$, $O_2$ and CO are used for the etching of ARC layers, then a high consumption of resist and oblique resist edges will be noted as a result. Moreover, the line width decreases and the line ends are patterned in a tapering manner.

Moreover, when etching with $CHF_3/CF_4/O_2/Ar$ or $CHF_3/CF_4/O_2$ gases (gas flow 80/50/20/16 sccm, p=160 mTorr, P=600W, B=20 Gauss) the CD performance is very poor, i.e. the line widths of the structures fabricated are reduced to an excessively great extent.

Figure 2:
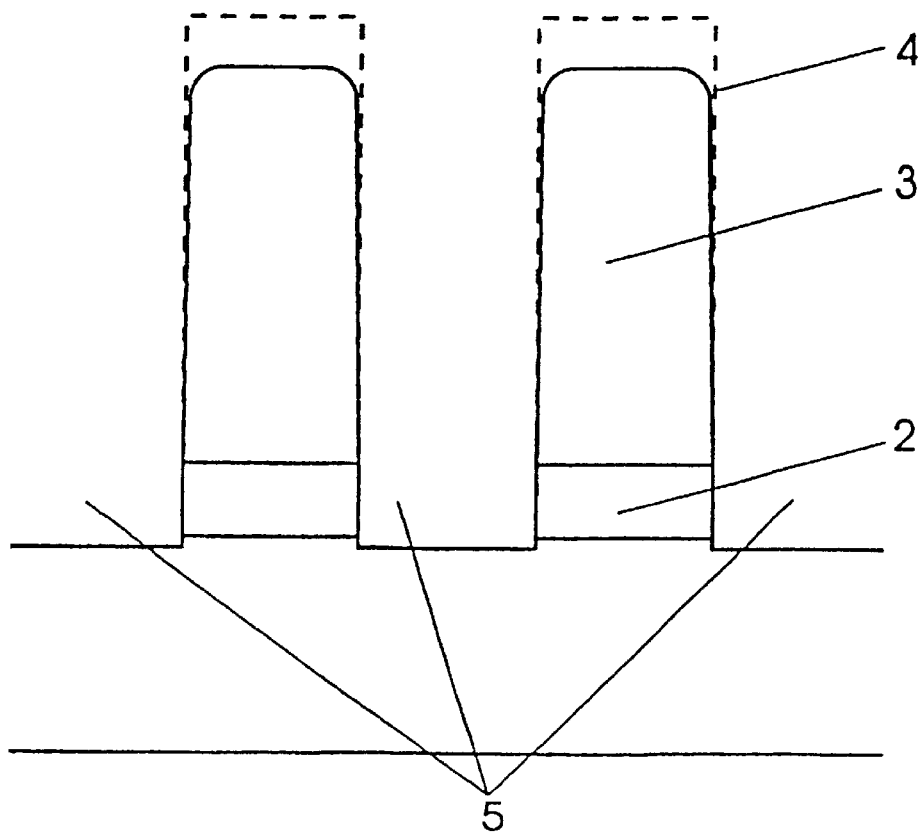
FIG. 2 is a diagrammatic illustration of an etching structure produced by the method according to the invention.

By contrast, if etching is effected using the formulation according to the invention, this results in a low consumption of photoresist and steep resist sidewalls. The result of the novel processing is diagrammatically illustrated in FIG. 2. This makes it possible to use small resist thicknesses, thereby extending the process window of the lithography. The steeper resist sidewalls result in a very good CD performance, i.e. dimensional accuracy of the etching trench 5, since the line widths remain constant and the line ends maintain their form. Moreover, no residues, so-called fences, remain on the resist sidewalls.

In order to achieve the advantages described, i.e. the best etching selectivity, the ARC open etching must be performed with the following process parameters:

| Quantity | Value | Unit |
|---|---|---|
| $CF_4$ | 35 ... 45 | sccm /* |
| $CHF_3$ | 17 ... 23 | sccm /* |
| $O_2$ | 5 ... 7 | sccm /* |
| Ar | 80 ... 120 | sccm /* |
| Pressure | 80 ... 120 | mTorr |
| Power | 550 ... 650 | watts |
| Magnetic field | 0 | Gauss |
| He rear-side cooling | 14 | Torr |

/* Gas flow

We claim:

1. In a method for patterning an organic antireflection layer by DUV lithography followed by ARC open etching, which comprises:

providing a substrate with a metal layer, a photoresist, and an antireflection layer as an intermediate layer of an organic polymer formed between the photoresist and the metal layer;

etching the (ARC polymer) intermediate layer in a $CF_4$ ARC open process with the following process parameters:

| | | |
|---|---|---|
| $CF_4$ | 35 ... 45 | sccm |
| $CHF_3$ | 17 ... 23 | sccm |
| O2 | 5 ... 7 | sccm |
| Ar | 80 ... 120 | sccm |
| Pressure | 80 ... 120 | mtorr |
| Power | 550 ... 650 | Watts | and with high selectivity with respect to the photoresist; and subsequently etching the metal layer beneath the antireflection layer.

2. The method according to claim 1, which comprises etching in an etching chamber with plasma assistance.

* * * * *